United States Patent [19]
Hoshino et al.

[11] Patent Number: 5,843,849
[45] Date of Patent: Dec. 1, 1998

[54] SEMICONDUCTOR WAFER ETCHING PROCESS AND SEMICONDUCTOR DEVICE

[75] Inventors: Kouichi Hoshino, Obu; Yoshiki Ueno, Okazaki; Takuya Kouya, Nagoya, all of Japan

[73] Assignees: Nippondenso Co., Ltd.; Research Development Corporation of Japan, both of Japan

[21] Appl. No.: 662,632

[22] Filed: Jun. 13, 1996

[30] Foreign Application Priority Data

Jun. 14, 1995 [JP] Japan ................................. 7-147871

[51] Int. Cl.[6] ................................................ H01L 21/302
[52] U.S. Cl. ......................... 438/738; 438/736; 438/740; 438/743
[58] Field of Search ................................... 438/718, 723, 438/738, 736, 740, 743

[56] References Cited

U.S. PATENT DOCUMENTS 5,370,767  12/1994  Miyakuni et al. ...................... 156/643
5,567,659  10/1996  Pakulski et al. ...................... 156/651.1

FOREIGN PATENT DOCUMENTS 63-208276  8/1988  Japan.
3-16228  1/1991  Japan.
3-225839  10/1991  Japan.

*Primary Examiner*—R. Bruce Breneman
*Assistant Examiner*—George Goudreau
*Attorney, Agent, or Firm*—Cushman Darby & Cushman Intellectual Property Group of Pillsbury Madison & Sutro, LLP

[57] ABSTRACT

A first semiconductor layer and a second semiconductor layer are laminated on a semiconductor wafer in that order. A resist pattern having an opening is formed on the second semiconductor layer. The second semiconductor layer is etched through the opening in the formed resist pattern to expose the first semiconductor layer. A surface oxide film is formed on the exposed surface of the first semiconductor layer and then selectively etched away. Alternatively, the exposed surface of the first semiconductor layer is subjected to a separate oxidization treatment and the resulting surface oxide film is selectively removed in the subsequent etching.

5 Claims, 4 Drawing Sheets

SEMICONDUCTOR WAFER ETCHING PROCESS AND SEMICONDUCTOR DEVICE

BACKGROUND OF THE INVENTION

1. Field of the Invention

The present invention relates to a process for etching a semiconductor wafer and to a semiconductor device, and particularly it relates to an etching process which is applied to a semiconductor wafer requiring selective etching of a multilayer semiconductor layer and which provides improved reproducibility of the characteristics and the structure of a semiconductor device obtained thereby.

2. Description of the Related Art

With the increasing higher frequency of MMICs (monolithic microwave ICs) in recent years, and in light of attempts to improve high-frequency performance including noise figure and gain, it has become indispensable to improve the reproducibility of the device characteristics of HEMTs (high electron mobility transistors) and other structural components of MMICs, and to obtain satisfactory impedance matching.

In addition, where devices such as HEMTs having a recess structure which is effective for improving high-frequency performance, the reproducibility of etching depth in etching prior to formation of Schottky gate is known to influence the reproducibility of the characteristics of the device.

Here, in semiconductor device production processes, such as the recess etching of HEMTs mentioned above, in which only the upper semiconductor layer of two different semiconductor layers is removed by selective etching, the etching time has traditionally been set to a time required to remove just the upper semiconductor layer, depending on the etching rate. Setting the etching time in this manner improves the reproducibility of the etching depth.

Thus, by setting the etching time to the time required to remove just the upper semiconductor layer, it is indeed possible to improve the reproducibility of the etching depth.

However, as a result of setting the etching time in this manner, an etching residue of the upper semiconductor layer is generated on the surface of the lower semiconductor layer after etching, and this adversely affects the element characteristics of the device.

Therefore, in order to prevent this, the above-mentioned etching time must be set somewhat longer than the time required to just remove the upper semiconductor layer.

Such a measure, however, where it is impossible to get a sufficient selective etching ratio of the upper semiconductor layer with respect to the lower semiconductor layer, or where the lower semiconductor layer has an extremely small thickness, leads to variation in the lower semiconductor layer remaining after etching, or recess etching depth variation, which also adversely affects the characteristics of the device.

On the other hand, as a method of increasing the selective etching ratio of the upper semiconductor layer with respect to the lower semiconductor layer in devices such as HEMTs, there is known, from Japanese Unexamined Patent Publication No. 63-208276 for example, a method wherein the compositions of the materials composing the semiconductor layers are adjusted, or an etching stop layer is inserted between them.

Nevertheless, such adjustment of the composition or film structure of the semiconductor layers in order to obtain a high selective etching ratio has not always given favorable results in terms of performance of the semiconductor device.

The present invention, which has been accomplished in light of these circumstances, is aimed at providing a process for etching a semiconductor wafer which requires selective etching of multilayer semiconductor layers, which suitably minimizes variations in the etching depth without adjustment of the composition or film structure of the semiconductor layers.

The present invention is further aimed at providing a device structure for a semiconductor device manufactured by selective etching of a multilayer semiconductor layer, which allows reliable improvement in the reproducibility of the device characteristics.

SUMMARY OF THE INVENTION

In order to achieve these aims, according to the invention, the process for etching a semiconductor wafer is designed to comprise a step of forming a resist pattern with an opening for etching on the surface of two different laminated semiconductor layers, a first etching step of etching the upper semiconductor layer up to the lower semiconductor layer surface from the opening in the formed resist pattern, and a second etching step of selectively etching a surface oxide film formed on the lower semiconductor layer surface which has been exposed by the first etching. Various aspects or embodiments of the present invention will be discussed below.

The process for etching a semiconductor wafer is designed to further comprise a step of oxidizing the lower semiconductor layer surface exposed by etching in the first etching step, so that in the second etching step the surface oxide film formed by the oxidizing treatment is removed by selective etching.

In another aspect of the invention, the same semiconductor wafer etching process is designed to comprise a step of forming a resist pattern with an opening for recess etching, on the surface of a high electron mobility transistor wafer having an InAlAs buffer layer, InGaAs channel layer, InAlAs spacer layer, InAlAs doped layer, InAlAs gate contact layer and InGaAs cap layer laminated on a semi-insulating InP substrate, a first etching step of etching the InGaAs cap layer to the InAlAs gate contact layer surface from the opening in the formed resist pattern, and a second etching step of selectively etching an InAlAs oxide film formed on the InAlAs gate contact layer surface which has been exposed by the first etching.

The etching process is designed to further comprise a step of oxidizing treatment of the InAlAs gate contact layer surface exposed by etching in the first etching step, so that in the second etching step the InAlAs oxide film formed by the oxidizing treatment is removed by selective etching.

Another aspect of the invention comprises a semiconductor device which is constructed so as to have two different laminated semiconductor layers, the semiconductor layers having an etching groove reaching from the upper semiconductor layer to the lower semiconductor layer, with the bottom of the etching groove terminating within the lower semiconductor layer.

Also, according to the invention, a semiconductor device is constructed so as to have a high electron mobility transistor wafer having an InAlAs buffer layer, an InGaAs channel layer, an InAlAs spacer layer, an InAlAs doped layer, an InAlAs gate contact layer and an InGaAs cap layer laminated on a semi-insulating InP substrate, wherein the InGaAs cap layer and the InAlAs gate contact layer have a recess etching groove from the InGaAs cap layer to the InAlAs gate contact layer, the bottom of the recess etching groove terminates within the InAlAs gate contact layer, and the gate electrode of the high electron mobility transistor contacts with the bottom of the recess etching groove terminating within the InAlAs gate contact layer.

DETAILED DESCRIPTION OF THE INVENTION

Figure 1A:
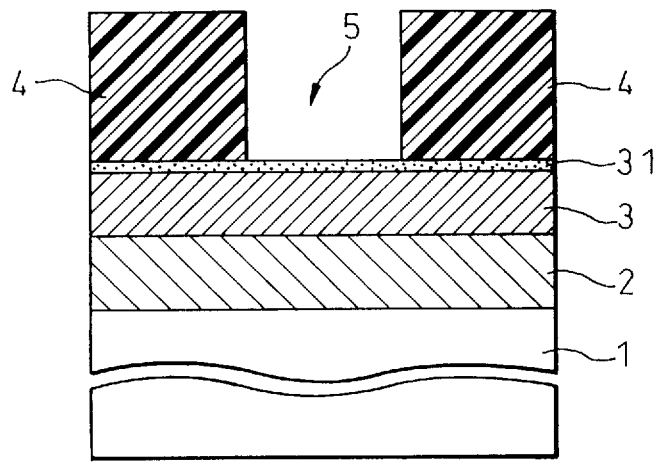
FIGS. 1A to 1C are a set of cross-sectional illustrations showing the basic principle of the etching process of the invention.

When the etching time is set to the time required to just remove the upper semiconductor layer for selective etching of two different laminated semiconductor layers, the reproducibility of the etching depth is improved, but an etching residue of the upper semiconductor layer is generated on the surface of the lower semiconductor layer after etching which adversely affects the element characteristics, as mentioned earlier.

It was also explained that even when, to prevent this occurrence, the above-mentioned etching time is set slightly longer than the time required to just remove the upper semiconductor layer, where it is impossible to get a sufficient selective etching ratio of the upper semiconductor layer with respect to the lower semiconductor layer, or where the lower semiconductor layer has an extremely small thickness, variation is produced in the etching depth, and this also adversely affects the element characteristics.

Therefore, by combining two different types of etching steps, namely:
  a first etching step of etching the upper semiconductor layer up to the lower semiconductor layer surface from an opening in the resist pattern and;
  a second etching step of selectively etching a surface oxide film formed on the lower semiconductor layer surface which has been exposed by the first etching,
  according to the present invention, even in cases where an etching residue of the upper semiconductor layer is generated on the surface of the lower semiconductor layer after completion the first etching, that etching residue is completely removed by the second etching step.

Thus, according to the etching process of the invention, variations in the etching depth are suitably minimized without any adjustment of the composition or film structure of the semiconductor layers, and hence any influence of the etching residue or etching depth variations on the element characteristics is properly avoided.

Furthermore, by employing a process which further comprises a step of oxidizing treatment of the lower semiconductor layer surface exposed by etching in the first etching step, so that in the second etching step the surface oxide film formed by the oxidizing treatment is removed by selective etching, according to the invention, it is possible to actively control even the post-etching thickness of the lower semiconductor layer by controlling the thickness of the oxide film formed on the lower semiconductor layer surface. Consequently, any influence that variations in the post-etching thickness of the lower semiconductor layer may have on the element characteristics is properly avoided, even in cases of extremely thin lower semiconductor layers.

Furthermore, another embodiment of the invention consists of combining two different types of etching steps on a high electron mobility transistor (HEMT) wafer having an InAlAs buffer layer, InGaAs channel layer, InAlAs spacer layer, InAlAs doped layer, InAlAs gate contact layer and InGaAs cap layer laminated on a semi-insulating InP substrate. The two steps comprise:
  a first etching step of etching the InGaAs cap layer to the InAlAs gate contact layer surface from the opening in the formed resist pattern, and;
  a second etching step of selectively etching an InAlAs oxide film formed on the InAlAs gate contact layer surface which has been exposed by the first etching,
  according to the present invention, so that even in cases where an etching residue of the InGaAs cap layer is generated on the surface of the InAlAs gate contact layer after completion of the first etching, that etching residue is completely removed by the second etching step.

Thus, according to the etching process of this invention as well, variations in the etching depth are suitably minimized without any adjustment of the composition or film structure of the semiconductor layers, and hence any influence of the etching residue or etching depth variations on the HEMT characteristics is properly avoided.

Furthermore, by employing a process which further comprises a step of oxidizing treatment of the InAlAs gate contact layer surface exposed by etching in the first etching step, so that in the second etching step the InAlAs oxide film formed by the oxidizing treatment is removed by selective etching, according to the invention, it is possible to actively control even the post-etching thickness of the InAlAs gate contact layer by controlling the thickness of the InAlAs oxide film formed on the InAlAs gate contact layer surface. Consequently, any influence that variations in the post-etching thickness of the InAlAs gate contact layer may have on the HEMT characteristics is properly avoided, even in cases of an extremely thin InAlAs gate contact layer.

Furthermore, by employing a construction wherein a semiconductor device comprises two different laminated semiconductor layers, the semiconductor layers having an etching groove reaching from the upper semiconductor layer to the lower semiconductor layer, with the bottom of the etching groove terminating within the lower semiconductor layer, according to the invention, it is possible to consistently realize a very stable apparatus structure without the adverse influence on the characteristics due to the aforementioned generated etching residue, or the adverse influence on the characteristics due to etching depth variations in the case of an extremely small film thickness of the lower semiconductor layer. This results in reliable improvement in the reproducibility of the device characteristics.

Furthermore, by employing a construction wherein a similar semiconductor device comprises a high electron mobility transistor (HEMT) wafer having an InAlAs buffer layer, InGaAs channel layer, InAlAs spacer layer, InAlAs doped layer, InAlAs gate contact layer and InGaAs cap layer laminated on a semi-insulating InP substrate, wherein the InGaAs cap layer and InAlAs gate contact layer have a recess etching groove from the InGaAs cap layer to the InAlAs gate contact layer, the bottom of the recess etching groove terminates within the InAlAs gate contact layer, and the gate electrode of the HEMT contacts with the bottom of the recess etching groove terminating within the InAlAs gate contact layer, according to the invention, it is also possible to consistently realize a very stable HEMT structure without the adverse influence on the characteristics due to the aforementioned etching residue generated on the InGaAs cap layer, or the adverse influence on the characteristics due to etching depth variations in the case of an extremely small film thickness of the InAlAs gate contact layer. This results in reliable improvement in the reproducibility of the HEMT device characteristics.

When the composition for the above-mentioned InGaAs channel layer for such an HEMT is selected as:

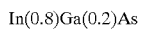

In(0.8)Ga(0.2)As the electron mobility is further increased, allowing further improvement in the high-frequency performance. In other words, by employing the same construction as the invention, HEMTs with this excellent high-frequency performance may be stably supplied.

In another embodiment of the present invention, the second semiconductor layer is constructed of a material with a slower etching rate than the first semiconductor layer for a given etching. Also, a resist pattern with an opening over a prescribed area is formed on the second semiconductor layer, and the second semiconductor layer is etched through the opening of the resist pattern until the first semiconductor layer is exposed by the given etching. The exposed surface of the first semiconductor layer is then oxidized to form an oxide film on the first semiconductor layer surface, and the oxide film is removed by etching. Since the oxidizing of first semiconductor layer allows fully controllable formation of an oxide film gradually from the surface of the first semiconductor layer, the oxidized film thickness may be precisely controlled. Control is thus possible so that the first semiconductor layer has a prescribed film thickness from the wafer side.

According to this embodiment, during the oxide film formation step, the oxide film formed on the second semiconductor layer is made thinner than the oxide film formed on the first semiconductor layer, and therefore, since the second semiconductor layer is not removed to any great degree in the subsequent second etching step, over-etching of the second semiconductor layer may be prevented.

In yet another embodiment of the invention, the cap layer is constructed of a material with a slower etching rate than the gate contact layer for a given etching. Also, a resist pattern with an opening over a prescribed area is formed on the cap layer, and the cap layer is etched through the opening of the resist pattern until the gate contact layer is exposed by the given etching. The exposed surface of the gate contact layer is then oxidized to form an oxide film on the gate contact layer surface, and the oxide film is removed by etching. Since the oxidizing of gate contact layer allows fully controllable formation of an oxide film gradually from the surface of the gate contact layer, the oxidized film thickness may be precisely controlled. Control is thus possible so that the gate contact layer has a prescribed film thickness from the wafer side. In addition, since during the oxide film formation step the oxide film formed on the cap layer is made thinner than the oxide film formed on the gate contact layer, the cap layer is not removed to any great degree in the subsequent second etching step, and thus over-etching of the cap layer may be prevented.

According to another embodiment of this invention, the cap layer is constructed of a material with a slower etching rate than the gate contact layer for a given etching. Also, a resist pattern with an opening over a prescribed area is formed on the cap layer, and the cap layer is etched through the opening of the resist pattern until the gate contact layer is exposed by the given etching. An oxide film is formed on the exposed surface of the gate contact layer at this time, but the oxide film is removed by etching. Since the oxidizing of gate contact layer allows fully controllable formation of an oxide film gradually from the surface of the gate contact layer, the gate contact layer may be controlled to a prescribed thickness from the wafer side. In addition, since the oxide film formed on the cap layer is made thinner than the oxide film formed on the gate contact layer, the cap layer is not removed to any great degree in the subsequent second etching step, and thus over-etching of the cap layer may be prevented.

According to another embodiment of this present invention, the second semiconductor layer formed on the first semiconductor layer is constructed of a material with a slower etching rate than the first semiconductor layer for a given etching, as well as a slower oxidizing rate than the first semiconductor layer. The gate contact layer may therefore be controlled to a prescribed thickness from the wafer side. In addition, since the oxide film formed on the cap layer in the oxide film formation step is made thinner than the oxide film formed on the gate contact layer, the cap layer is not shaved off to any great degree in the subsequent second etching step, and thus over-etching of the cap layer may be prevented.

According to another embodiment of the present invention, the cap layer formed on the gate contact layer is constructed of a material with a slower etching rate than the gate contact layer for a given etching, as well as a slower oxidizing rate than the gate contact layer. The gate contact layer may therefore be controlled to a prescribed thickness from the wafer side. In addition, since the oxide film formed on the cap layer in the oxide film formation step is made thinner than the oxide film formed on the gate contact layer, the cap layer is not removed to any great degree in the subsequent second etching step, and thus over-etching of the cap layer may be prevented.

According to another embodiment of the present invention, the cap layer is constructed in two sections sandwiching a second groove, with one side as the source layer and the other side as the drain layer. The source/drain resistance is determined by the width of the first groove, with a large width resulting in a larger source/drain resistance. Since over-etching of the cap layer is prevented according to the invention, increase in the source/drain resistance is also prevented.

EXAMPLES

Figure 1B:
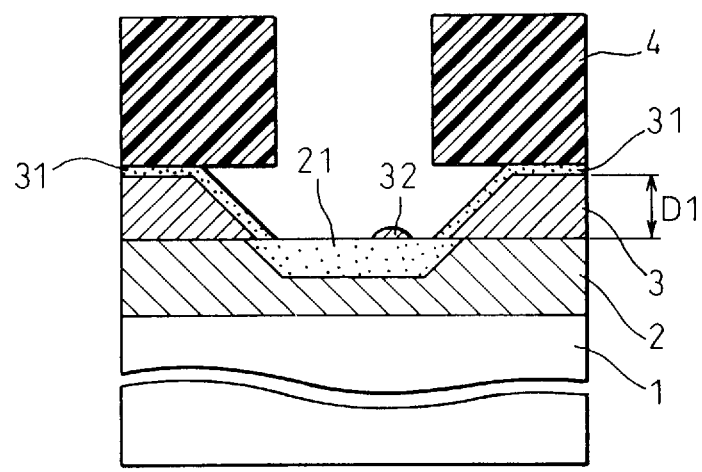
Figure 1C:
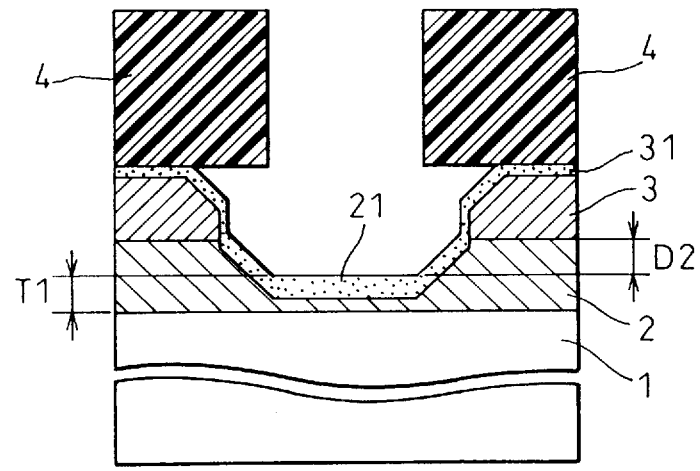

FIGS. 1A to 1C illustrate the basic principle of the semiconductor wafer etching process of the invention.

In this etching process, as shown in FIG. 1A, a resist (pattern) 4 is first formed having an opening 5 for etching the surface of two different laminated semiconductor layers, i.e. a first semiconductor layer 2 and a second semiconductor layer 3 on a semiconductor wafer 1.

Here, the surface of the upper second semiconductor layer 3 is covered with an oxide film formed by oxidation of the second semiconductor layer 3, i.e. a second semiconductor layer-oxide film layer 31.

The above-mentioned resist 4 is actually adhered onto the second semiconductor layer-oxide film layer 31 and the resist opening 5 is formed by a treatment involving a well-known resist photo process.

Next, as the first etching treatment from the formed resist opening 5, the upper second semiconductor layer 3 is etched to the surface of the lower first semiconductor layer 2, as shown in FIG. 1B.

For this etching, for example, the etching solution and etching conditions are selected so as to produce a faster etching rate on the upper second semiconductor layer 3 than the lower first semiconductor layer 2. This allows selective etching of the upper second semiconductor layer 3, and after etching to only the film thickness of the upper second semiconductor layer 3, the etching may be stopped leaving the surface of the lower first semiconductor layer 2 exposed. The etching depth D1 here will be roughly equal to the value of the second semiconductor layer-oxide film layer 31 plus the thickness of the upper second semiconductor layer 3.

Naturally, this etching itself is not carried out in a completely uniform manner on the semiconductor wafer. Therefore, when the etching time is set to the time required to just remove only the upper second semiconductor layer 3, a residue of the upper second semiconductor layer 3, i.e. an etching residue 32 will be produced according to the embodiment shown in FIG. 1B.

Then, after this selective etching has been performed on the upper second semiconductor layer 3, as also shown in FIG. 1B, the exposed surface of the lower first semiconductor layer 2 is oxidized, to form a new first semiconductor layer-oxide film layer 21 on that surface.

In this etching process, as a second etching treatment, selective etching removal of the newly formed first semiconductor layer-oxide film layer 21 is performed from the same resist opening 5, according to the embodiment shown in FIG. 1C.

By performing this second etching, the aforementioned etching residue 32 produced on the surface of the lower first semiconductor layer 2 is completely removed. The etching depth D2 of the second etching then corresponds to the thickness of the newly formed first semiconductor layer-oxide film layer 21, and finally the lower first semiconductor layer 2 is ensured of having the film thickness shown together as T1 in FIG. 1C, as the post-etching film thickness.

Incidentally, conventional efforts to prevent the generation of the etching residue 32 have involved setting the etching time to be somewhat longer than the time required to just remove the upper semiconductor layer 3. Such lengthening of the etching time, however, has allowed progression of etching of the lower semiconductor layer 2 as well, and it has been difficult to appropriately control the post-etching film thickness (refer to T1 in FIG. 1C). Furthermore, especially in cases where the lower semiconductor layer 2 has an extremely small thickness, variations in this post-etching film thickness have had an adverse influence on the element characteristics which cannot be ignored.

Thus, according to the etching process shown in FIGS. 1A to 1C, even in cases where an etching residue 32 of the upper semiconductor layer 3 is generated on the surface of the lower semiconductor layer 2 after completion the first etching, the etching residue 32 is completely removed by the second etching. Furthermore, since the second etching accomplishes selective etching of the first semiconductor layer-oxide film layer 21 formed earlier, variations in the etching depth D2 or post-etching film thickness T1 are suitably minimized without any adjustment of the composition or film structure of the semiconductor layers, and hence their influence on the element characteristics is properly avoided.

In this etching process, further oxidizing treatment of the surface of the lower semiconductor layer 2 exposed by the first etching step may also be performed. In this second etching step, the surface oxide film layer 21 of the lower semiconductor layer 2 formed by the oxidizing treatment is removed by selective etching.

According to this process, it is possible to actively control even the post-etching thickness of the lower semiconductor layer 2, i.e. the film thickness T1 remaining after etching, by controlling the thickness of the oxide film 21 formed on the surface of the lower semiconductor layer 2. Consequently, any influence that variations in the post-etching thickness T1 have on the element characteristics is completely avoided, even in the case of an extremely thin lower semiconductor layer 2.

Example 1

FIGS. 2A through 2D show a first example of the semiconductor wafer etching process according to the invention which is based on the above principle.

In this example, the etching process based on the principle described above is applied to a recess etching process for an HEMT (high electron mobility transistor) with InAlAs (indium/aluminum/arsenic) as the doped layer supplying the carrier and InGaAs (indium/gallium/arsenic) as the channel layer for movement of the carrier.

FIGS. 2A through 2D illustrate stages of the recess etching process for the HEMT. The etching process according to this example is explained in order below, with reference to FIG. 2.

Figure 2A:
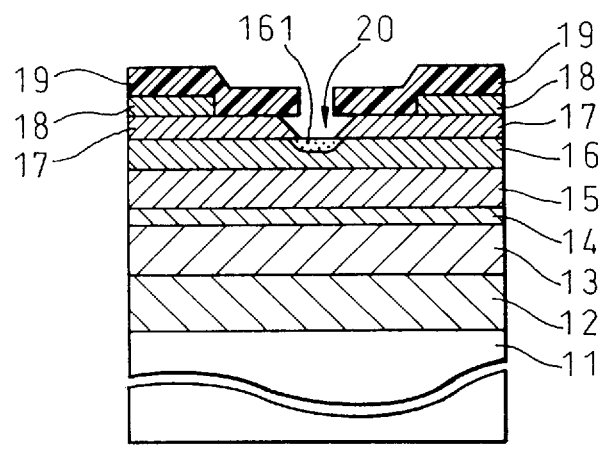
FIGS. 2A to 2D are a set of cross-sectional illustrations showing the etching steps of Example 1 of the invention.

(1) First, as shown in FIG. 2A, a resist 19 with an opening for recess etching is formed on the surface of an HEMT wafer having an In(0.52)Al(0.48)As buffer layer 12, In(0.8)Ga(0.2)As channel layer 13, In(0.52)Al(0.48)As spacer layer 14, In(0.52)Al(0.48)As doped layer 15, In(0.52)Al(0.48)As gate contact layer 16 and In(0.53)Ga(0.47)As cap layer 17 laminated on a semi-insulating InP (indium/phosphorus) wafer 11 to the respective film thicknesses shown in FIG. 2A. Formation of the opening of the resist 19 by a well-known resist photo process was described above. In FIGS. 2A through 2D, the numerals 18 denote ohmic electrodes forming either a drain electrode or source electrode of the HEMT. Also, the above-mentioned In(0.52)Al(0.48)As doped layer 15 and In(0.53)Ga(0.47)As cap layer 17 on the HEMT wafer are n-doped to a high density. In particular, the composition $$In(0.8)Ga(0.2)As$$

of the InGaAs channel layer 13 on the HEMT wafer further increases the electron mobility thereof, thus providing further improvement in the high-frequency performance. Hereunder, the compositions of In, Al and Ga will be omitted for convenience.

(2) Once the resist 19 has been formed, selective recess etching is performed on the InGaAs cap layer 17 from the opening as a first etching treatment, until the InAlAs gate contact layer 16 is exposed. The etching method used for this is one which accomplishes selective etching of the InGaAs cap layer 17 with respect to the InAlAs gate contact layer 16, such as, for example, wet etching using citric acid, hydrogen peroxide water and water. This recess etching results in formation of a recess etching groove 20 in the opening of the resist 19 such as shown in FIG. 2A. At this time, an InAlAs surface oxide film 161 is formed on the surface of the InAlAs gate contact layer 16 exposed at the bottom of the recess etching groove 20, as also shown in FIG. 2A.

Figure 2B:
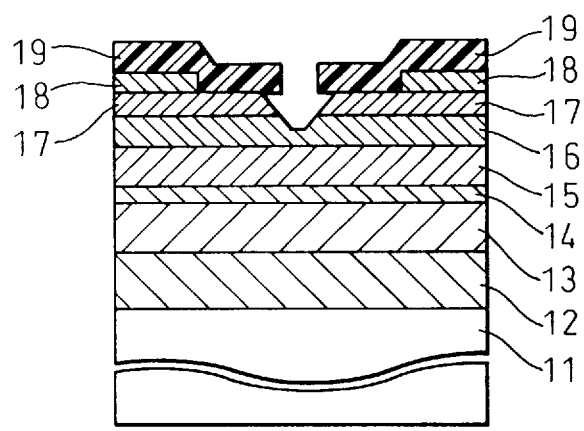

(3) With this structure, the formed InAlAs surface oxide film 161 is removed by selective etching as a second etching treatment from the opening, according to the embodiment shown in FIG. 2B. This may be effectively accomplished by wet etching or the like with, for example, hydrofluoric acid and ammonium fluoride.

Figure 2C:
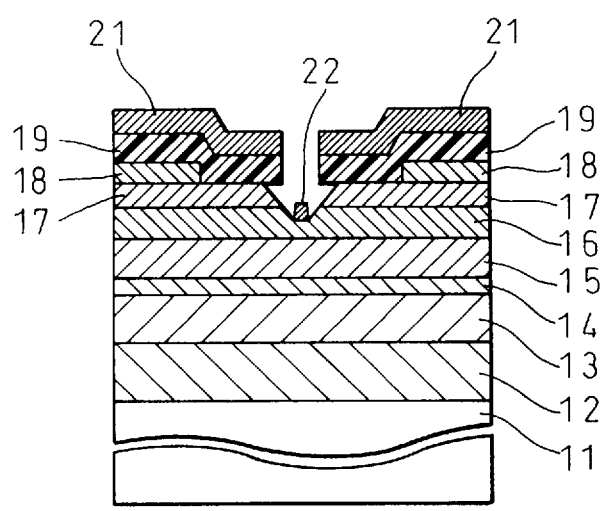

(4) After obtaining the etching groove which reaches about midway through the InAlAs gate contact layer 16, a gate electrode material 21 is vacuum deposited from above the structure, to obtain a gate electrode 22 contacting with the InAlAs gate contact layer 16 at the bottom of the groove, according to the embodiment shown in FIG. 2C.

Figure 2D:
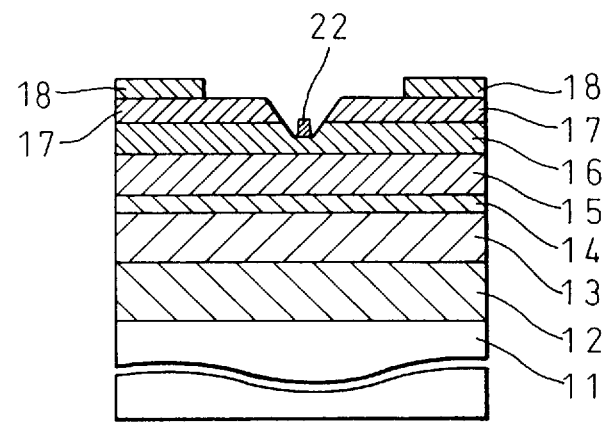

(5) The resist 19 is then dissolved with an organic solvent such as acetone, removing it along with the gate electrode material 21 adhering to it, to obtain an HEMT structure having the structure shown in FIG. 2D.

Thus, according to the etching process of this example, stable formation of an etching groove of a desired depth can be accomplished during recess etching of an HEMT wafer with a very minute structure. This makes it possible to achieve a reliable Schottky contact with the InAlAs gate contact layer 16 of the gate electrode 22.

Incidentally, in cases where the recess etching in the first etching treatment of (2) above is too shallow (including cases in which the etching time is set to the time required to just remove the above-mentioned InGaAs cap layer 17), a residue of the InGaAs cap layer 17 is produced by the same principle described earlier. Since a Schottky barrier height cannot be obtained in the residue sections in such cases, a reverse gate leak current is generated in the HEMT.

On the other hand, the film thickness of the InAlAs gate contact layer 16 in contact with the gate electrode 22 is extremely small at 10 nm, as shown in FIG. 2A. Therefore, if the recess etching is too deep, a tunnel current from the gate electrode 22 penetrating the InAlAs gate contact layer 16 flows to the InAlAs doped layer 15, thus generating a reverse gate leak current.

Thus, according to the etching process of this example, even in cases where an etching residue of the InGaAs cap layer 17 is produced on the InAlAs gate contact layer 16, the residue is completely removed along with the InAlAs surface oxide film 161 by the second etching treatment in (3) above.

Also, since according to the etching process of this example the film thickness of the InAlAs gate contact layer 16 after the second etching is determined by the film thickness of the InAlAs surface oxide film 161, variations, etc. are suitably minimized.

Figure 3:
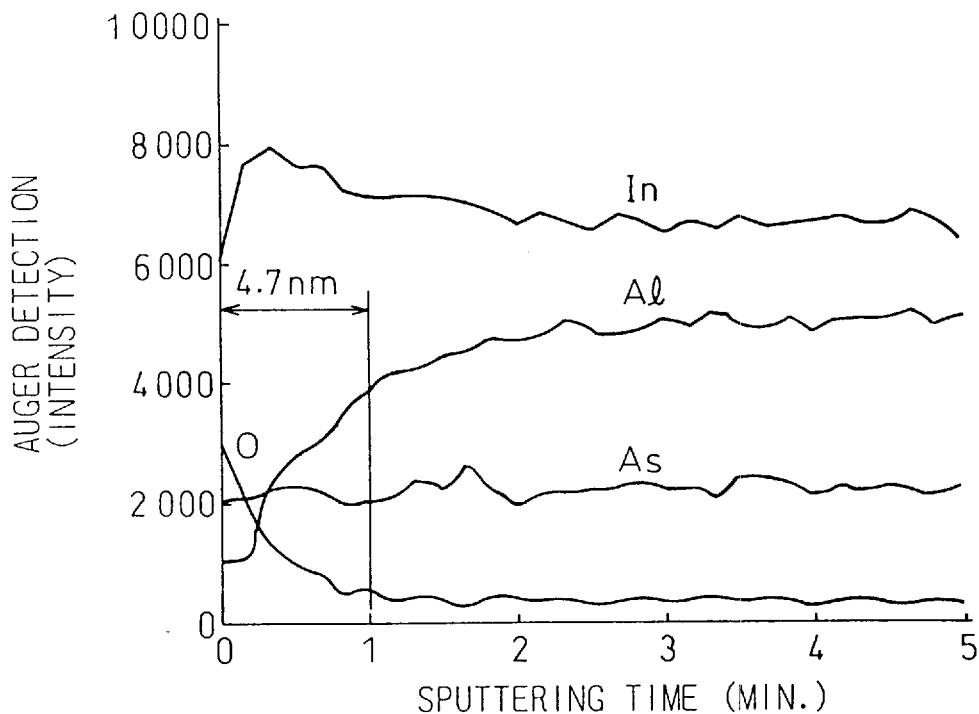
FIG. 3 is a graph showing the depth orientation density profile based on Auger analysis of the InAlAs surface oxide film formed during the steps of Example 1.

FIG. 3 shows the depth orientation density profile from the surface of the InAlAs surface oxide film 161 measured by Auger analysis, after wet etching using an etching solution comprising citric acid, hydrogen peroxide water and water, as the first etching treatment in (2) above according to the etching process of this example.

Judging from the density profile shown in FIG. 3, the Auger detection intensity for oxygen "O" decays at a sputtering time of about 1 minute. In other words, if calculated based on an etching rate of 4.77 nm/min, the oxygen "O" density disappears from the surface at about 4.7 nm, indicating that the film thickness of the InAlAs surface oxide film 161 is about 4.7 nm.

This shows that the etching depth in the recess etching of this example is about 25 nm, or the thickness of the InAlAs surface oxide film 161 added to the 20 nm film thickness of the InGaAs cap layer 17. Also, it is clear that the post-etching film thickness of the InAlAs gate contact layer 16 (corresponding to T1 of FIG. 1C) is about 5 nm, after subtracting the thickness of the InAlAs surface oxide film 161 from the 10 nm film thickness of the InAlAs gate contact layer 16.

Example 2

A second example of the semiconductor wafer etching process according to the invention based on the principle described above will now be explained.

In this example as well, the etching process based on the principle described above is applied to a recess etching process for an HEMT, and the explanation of this etching process will center on the differences with the etching process of Example 1.

It was mentioned that in FIG. 3 the thickness of the InAlAs surface oxide film 161 formed after the treatment in (2) of Example 1, i.e. after the first etching treatment, is about 4.7 nm.

In this second example, completion of the first etching treatment in (2) is followed by an oxidizing treatment with oxygen plasma or the like to further increase the thickness of the InAlAs surface oxide film 161.

That is, this oxidizing treatment with oxygen plasma or the like may be performed to increase the thickness of the InAlAs surface oxide film 161 once the first etching of Example 1 shown in FIG. 2A has been completed.

Adjusting the thickness of the InAlAs surface oxide film 161 formed in this manner also allows active control of the post-etching film thickness of the InAlAs gate contact layer 16 (corresponding to T1 in FIG. 1C).

Figure 4:
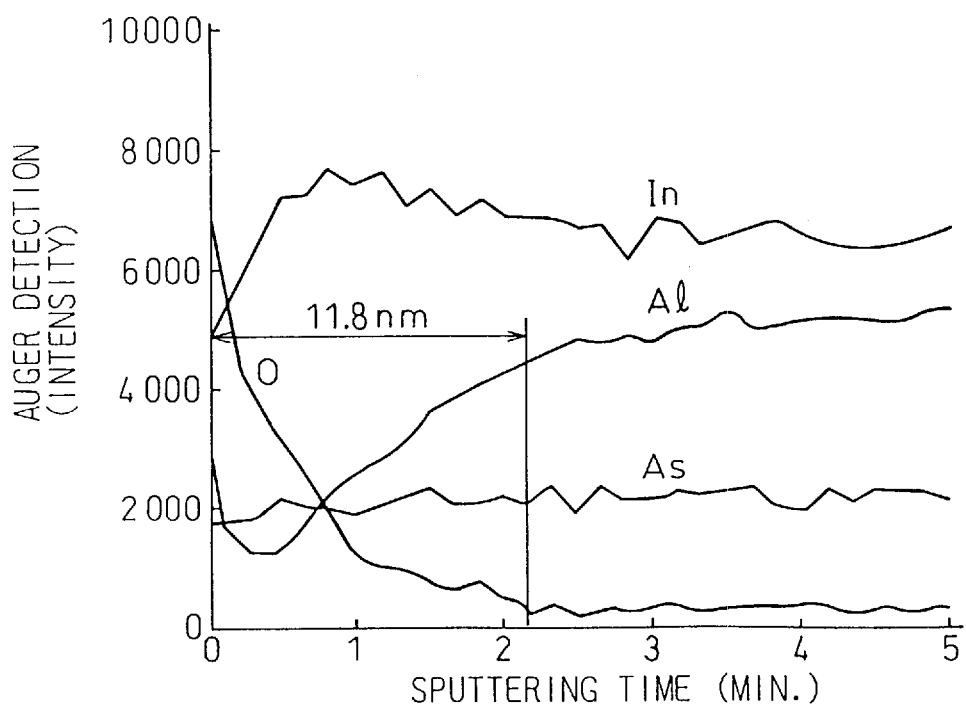
FIG. 4 is a graph showing the depth orientation density profile based on Auger analysis of the InAlAs surface oxide film formed by the oxidizing treatment in Example 2 of the invention.

FIG. 4 shows, similar to FIG. 3, the depth orientation density profile from the surface of the InAlAs surface oxide film 161 measured by Auger analysis, after performing oxidizing treatment with oxygen plasma on the surface of the InAlAs gate contact layer 16.

As shown in FIG. 4, when this oxidizing treatment has been performed, the Auger detection intensity for oxygen "O" decays at a longer sputtering time of just over 2 minutes. In other words, if calculated based on an etching rate of 4.77 nm/min, the oxygen "O" density disappears from the surface at about 11.8 nm, indicating that the thickness of the InAlAs surface oxide film 161 is about 11.8 nm in this case.

Consequently, if the film thickness of the InAlAs gate contact layer 16 is greater than about 11.8 nm, then it is possible to set the post-etching film thickness of the InAlAs gate contact layer 16 based on the calculation:

film thickness of InAlAs gate contact layer 16—11.8 nm by selective removal of the InAlAs surface oxide film 161 in the second etching.

This process, incidentally, is useful when it is desired to leave a consistent thin film thickness as the post-etching film thickness, and for example, if the film thickness of the InAlAs gate contact layer 16 is set to 12 nm, this process may be used to consistently leave an extremely thin film of about 0.2 nm as the post-etching film thickness.

Although the principle in both Examples 1 and 2 was described referring only to the etching process for a semiconductor wafer with two different laminated semiconductor layers, the structure of the semiconductor device formed by this etching process is significant in that it allows greater reproducibility of the device characteristics.

In other words, by employing a construction wherein a semiconductor device comprises two different laminated semiconductor layers 2 and 3, the semiconductor layers having an etching groove reaching from the upper semiconductor layer 3 to the lower semiconductor layer 2, with the bottom of the etching groove terminating within the lower semiconductor layer 2, as shown in FIG. 1, it is possible to consistently realize a very stable apparatus structure without the adverse influence on the characteristics due to the aforementioned generated etching residue 32, or the adverse influence on the characteristics due to etching depth variations in the case of an extremely small film thickness of the lower semiconductor layer 2. This results in reliable improvement in the reproducibility of the device characteristics.

Furthermore, by employing a construction wherein a semiconductor device comprises an HEMT wafer having an InAlAs buffer layer 12, InGaAs channel layer 13, InAlAs spacer layer 14, InAlAs doped layer 15, InAlAs gate contact layer 16 and InGaAs cap layer 17 laminated on a semi-insulating InP substrate 11, wherein the InGaAs cap layer 17 and InAlAs gate contact layer 16 have a recess etching groove 20 reaching from the InGaAs cap layer 17 to the InAlAs gate contact layer 16, the bottom of the recess etching groove 20 terminates within the InAlAs gate contact layer 16, and the gate electrode 22 of the HEMT contacts the bottom of the recess etching groove 20 terminating within the InAlAs gate contact layer 16, as shown in FIG. 2, it is also possible to consistently realize a very stable HEMT structure without the adverse influence on the characteristics due to the etching residue generated on the InGaAs cap layer 17, or the adverse influence on the characteristics due to etching depth variations in the case of an extremely small film thickness of the InAlAs gate contact layer 16. This results in reliable improvement in the reproducibility of the HEMT device characteristics.

It will be obvious that the etching process and semiconductor device structure of the present invention is not limited to the aforementioned application to HEMTs. This etching process or structure may be applied to any semiconductor wafer or semiconductor device on which selective etching of two different laminated semiconductor layers is a goal, according to the principle described above, to thus provide a major improvement in the reproducibility of the device characteristics.

As explained above, according to the etching process of the present invention it is possible to suitably control variations in the etching depth on semiconductor wafers which require selective etching of multilayer semiconductor layers, without adjustment of the composition or film structure of the semiconductor layers.

A semiconductor device according to the invention also allows reliable improvement in the reproducibility of the device characteristics of semiconductor devices constructed by performing selective etching of multilayer semiconductor layers.

We claim:

1. A process for etching a semiconductor wafer comprising:

forming a resist pattern with an opening for recess etching, on the surface of a high electron mobility transistor wafer having an InAlAs buffer layer, InGaAs channel layer, InAlAs spacer layer, InAlAs doped layer, InAlAs gate contact layer and InGaAs cap layer laminated on a semi-insulating InP substrate, first etching said InGaAs cap layer up to said InAlAs gate contact layer surface from the opening in the formed resist pattern, and selectively etching an InAlAs oxide film formed on said InAlAs gate contact layer surface exposed by the first etching.

2. The process according to claim 1, further comprising:

oxidizing said InAlAs gate contact layer surface exposed by the first etching, wherein, the selective etching etches only the InAlAs oxide film formed by the oxidizing treatment, thereby leaving a portion of the underlying IAlAs gate contact layer unetched.

3. A process for etching a semiconductor wafer having a first semiconductor layer and a second semiconductor layer, comprising:

laminating the first semiconductor layer having a first oxidation surface and the second semiconductor layer having a second oxidation surface on said wafer in that order, wherein the second semiconductor layer is made of a material with a slower etching rate than the first semiconductor layer, forming a resist pattern having an opening on said second semiconductor layer, first etching the second semiconductor layer through the opening of the resist pattern until the first oxidation surface of the first semiconductor layer is exposed by the etching and the second oxidation surface defines an aperture in the second semiconductor layer, forming an oxide film wherein the second oxidation surface and the first oxidation surface exposed in the first etching are oxidized to form an oxide film on surfaces of said first semiconductor layer and said second semiconductor layer, wherein the oxide film formed on said second oxidation surface is thinner than the oxide film formed on said first oxidation surface, and selectively etching the oxide film to expose the first semiconductor layer and the second semiconductor layer.

4. A process for etching a semiconductor wafer comprising:

laminating a semiconductor layer, a gate contact layer and a cap layer which is made of a material with a slower etching rate than said gate contact layer for a given etching, in that order on a wafer, forming a resist pattern with an opening on said cap layer, first etching said cap layer through said opening of said resist pattern until said gate contact layer is exposed by the etching, oxidizing the surface of said cap layer and said gate contact layer exposed in said first etching step to form an oxide film on the surfaces of said cap layer and said gate contact layer, the oxide film formed on said cap layer being thinner than the oxide film formed on said gate contact layer, and second etching said oxide film to expose said cap layer and said gate contact layer, wherein during said oxidizing, said oxide film is formed to give a predetermined thickness to said gate contact layer exposed by said second etching step.

5. A process of etching a semiconductor wafer comprising:

laminating a semiconductor layer, a gate contact layer and a cap layer which is made of a material with a slower etching rate than said gate contact layer for a given etching, in that order on a wafer, forming a resist pattern with an opening on said cap layer, first etching said cap layer through said opening of said resist pattern until said gate contact layer is exposed by the etching, and oxide films are formed on surfaces of said cap layer and said gate contact layer after the etching, the oxide film formed on said cap layer being thinner than the oxide film formed on said gate contact layer, and second etching said oxide film to expose said cap layer and said gate contact layer.

* * * * *